US011127451B2

(12) United States Patent
Lee (10) Patent No.: US 11,127,451 B2
(45) Date of Patent: Sep. 21, 2021

(54) MEMORY SYSTEM WITH MINIMIZED HEAT GENERATION WHICH INCLUDES MEMORY THAT OPERATES AT CRYOGENIC TEMPERATURE

(71) Applicant: SK hynix Inc., Gyeonggi-do (KR)

(72) Inventor: Se-Won Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/564,837

(22) Filed: Sep. 9, 2019

(65) Prior Publication Data
US 2020/0176049 A1 Jun. 4, 2020

(30) Foreign Application Priority Data

Nov. 30, 2018 (KR) .................. 10-2018-0152417

(51) Int. Cl.
| G11C 11/4074 | (2006.01) |
| G11C 11/4093 | (2006.01) |
| F25D 3/10 | (2006.01) |
| H01L 23/44 | (2006.01) |
| G11C 11/4072 | (2006.01) |
| G11C 7/04 | (2006.01) |
| G11C 11/4076 | (2006.01) |
| G11C 11/406 | (2006.01) |

(52) U.S. Cl.
CPC ............ G11C 11/4074 (2013.01); F25D 3/10 (2013.01); F25D 3/102 (2013.01); G11C 7/04 (2013.01); G11C 11/4072 (2013.01); G11C 11/4076 (2013.01); G11C 11/4093 (2013.01); H01L 23/445 (2013.01); G11C 11/40626 (2013.01)

(58) Field of Classification Search
CPC ............ G11C 11/4074; G11C 11/4093; G11C 11/4072; G11C 7/04; G11C 11/40626; G11C 11/4076; F25D 3/102; H01L 23/445
See application file for complete search history.

(56) References Cited

U.S. PATENT DOCUMENTS

| 2,019,027 A | * | 10/1935 | Stansbury | ............ | B23K 11/248 |
| | | | | | 219/108 |
| 4,771,366 A | * | 9/1988 | Blake | ...................... | G06F 1/189 |
| | | | | | 257/713 |
| 6,285,550 B1 | * | 9/2001 | Belady | .................. | H01L 23/467 |
| | | | | | 165/104.33 |

(Continued)

FOREIGN PATENT DOCUMENTS

| KR | 10-2016-0069483 | 6/2016 | | |
| WO | WO-2013015610 A2 | * | 1/2013 | .............. F25B 21/04 |

OTHER PUBLICATIONS

"Cryogenic Electronics and Quantum Information Processing", International Roadmap for Devices and Systems: 2018 (Year: 2018).*

*Primary Examiner* — Mushfique Siddique
(74) *Attorney, Agent, or Firm* — IP & T Group LLP (57) ABSTRACT

A memory system includes a voltage generator disposed in a high temperature region, and suitable for generating a first voltage; a memory disposed in a low temperature region, and suitable for using a second voltage; and a voltage converter disposed between the high temperature region and the low temperature region, suitable for converting the first voltage into the second voltage, and including a core made from a material having lower heat conductivity than a metal.

27 Claims, 4 Drawing Sheets

(56) References Cited

U.S. PATENT DOCUMENTS

| | | | | |
|---|---|---|---|---|
| 8,659,897 | B2* | 2/2014 | Meijer | G06F 1/20 |
| | | | | 361/699 |
| 10,345,836 | B1* | 7/2019 | Ware | G05F 1/567 |
| 2006/0185379 | A1* | 8/2006 | Shapiro | H05K 7/20372 |
| | | | | 62/259.2 |
| 2007/0272293 | A1* | 11/2007 | Schmidt | H01L 35/00 |
| | | | | 136/205 |
| 2013/0263608 | A1* | 10/2013 | Thornton-Wood | F25D 3/102 |
| | | | | 62/49.1 |
| 2015/0089961 | A1* | 4/2015 | Duzly | G11C 7/04 |
| | | | | 62/3.3 |
| 2016/0062435 | A1* | 3/2016 | Arakawa | G06F 11/1008 |
| | | | | 714/764 |
| 2016/0116925 | A1* | 4/2016 | Freeman | H02M 3/156 |
| | | | | 307/130 |
| 2017/0090533 | A1* | 3/2017 | Ware | G06F 1/26 |
| 2017/0162252 | A1* | 6/2017 | Ware | G11C 11/4097 |
| 2019/0187764 | A1* | 6/2019 | VanGilder | G06F 30/13 |
| 2020/0185011 | A1* | 6/2020 | Park | G11C 7/12 |

* cited by examiner

MEMORY SYSTEM WITH MINIMIZED HEAT GENERATION WHICH INCLUDES MEMORY THAT OPERATES AT CRYOGENIC TEMPERATURE

CROSS-REFERENCE TO RELATED APPLICATION

This application claims priority under 35 U.S.C. § 119 to Korean Patent Application No. 10-2018-0152417, filed on Nov. 30, 2018, the disclosure of which is incorporated herein by reference in its entirety.

BACKGROUND

1. Field

Various embodiments of the present invention generally relate to a semiconductor design technique. Particularly, various embodiments relate to a memory system including a memory that operates at a cryogenic temperature.

2. Description of the Related Art

A memory operating at a cryogenic temperature consumes significantly less power than a memory operating at room temperature. For example, a DRAM operating at a cryogenic temperature has a relatively longer data retention time of a memory cell than that of a DRAM operating at room temperature. Therefore, the DRAM operating at the cryogenic temperature reduces power consumption by minimizing the refresh operation or maximizing the refresh period.

However, when the cryogenic temperature state cannot be maintained, that is, the temperature rises, malfunction of the memory operating at the cryogenic temperature may be caused. Accordingly, power consumption occurs due to the process for resolving the malfunction and the process for maintaining the state of the cryogenic temperature, that is, for lowering the increased temperature.

SUMMARY

Various embodiments of the present invention are directed to a memory system with a minimized possibility of heat generation.

In accordance with an embodiment, a memory system includes: a voltage generator disposed in a high temperature region, and suitable for generating a first voltage; a memory disposed in a low temperature region, and suitable for using a second voltage; and a voltage converter disposed between the high temperature region and the low temperature region, suitable for converting the first voltage into the second voltage, and including a core made from a material having lower heat conductivity than a metal.

In accordance with another embodiment, a memory system includes: a voltage generator disposed in a high temperature region, and suitable for generating a first voltage based on voltage information; a memory disposed in a low temperature region, and suitable for storing a write data signal and outputting a read data signal by using a second voltage; a first signal converter disposed in the low temperature region, and suitable for generating a digital signal corresponding to the second voltage; a voltage converter disposed between the high temperature region and the low temperature region, suitable for converting the first voltage into the second voltage, and including a core made from a material having lower heat conductivity than a metal; an interface disposed between the high temperature region and the low temperature region, and suitable for generating a first information signal based on the read data signal and the digital signal, and generating the write data signal based on a second information signal; a controller disposed in the high temperature region, and suitable for outputting the first information signal as a feedback signal or processing the first information signal according to a read operation, and generating the second information signal according to a write operation; and a second signal converter suitable for generating the voltage information corresponding to the feedback signal.

In accordance with another embodiment, a cryogenic memory system includes: a voltage generator suitable for generating a first voltage; a cryogenic memory operable based on a second voltage; and a voltage provider configured to provide the cryogenic memory with the second voltage based on the first voltage received from the voltage generator, and to block heat transfer from a first temperature to a second temperature lower than the first temperature.

DETAILED DESCRIPTION

Various embodiments of the present invention are described below in more detail with reference to the accompanying drawings. These embodiments are provided so that this disclosure is thorough and complete, and fully conveys the scope of the present invention to those skilled in the art. We note, however, that the present invention may be embodied in different forms and variations, and should not be construed as being limited to the embodiments set forth herein.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

It is noted that reference to "an embodiment," "another embodiment" or the like does not necessarily mean only one embodiment, and different references to any such phrase are not necessarily to the same embodiment(s).

Hereinafter, the various embodiments of the present invention will be described in detail with reference to the attached drawings.

Figure 1:
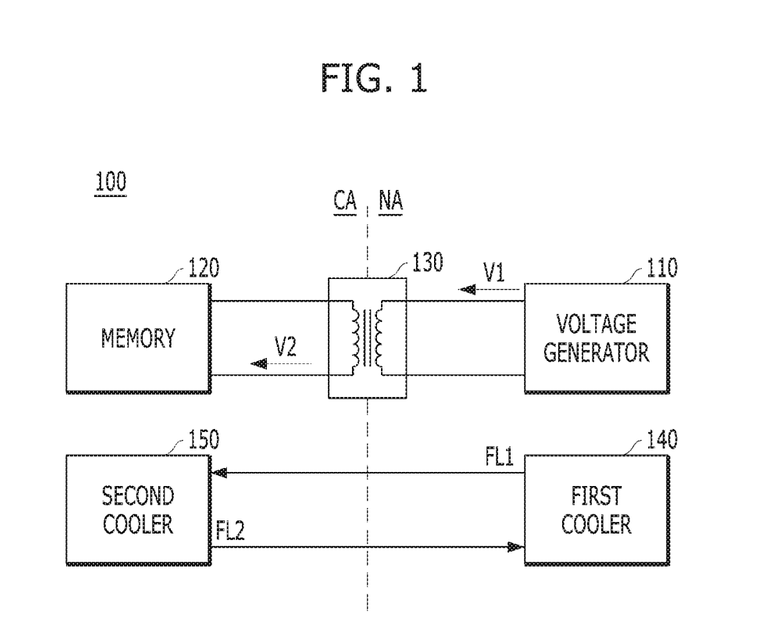
FIG. 1 is a block diagram illustrating a memory system in accordance with an embodiment.

FIG. 1 is a block diagram illustrating a memory system 100 in accordance with an embodiment.

Referring to FIG. 1, the memory system 100 may include a voltage generator 110, a memory 120, a voltage converter 130, a first cooler 140 and a second cooler 150.

The voltage generator 110 and the first cooler 140 may be disposed in a high temperature region NA because the voltage generator 110 and the first cooler 140 generate a relatively large amount of heat. For example, the high temperature region NA may have a temperature range that includes room temperature (e.g., 300K). The memory 120 and the second cooler 150 may be disposed in a low temperature region CA. For example, the low temperature region CA may have a temperature range that includes a cryogenic temperature (e.g., 77K or lower). The voltage converter 130 may be disposed between the high temperature region NA and the low temperature region CA. In other words, a portion of the voltage converter 130 may be disposed in the high temperature region NA, and the remaining portion of the voltage converter 130 may be disposed in the low temperature region CA (refer to FIG. 2).

Although it is described in the present embodiment that the voltage generator 110 and the first cooler 140 of the memory system 100 are disposed in the high temperature region NA and the memory 120 and the second cooler 150 are disposed in the low temperature region CA, the present embodiment is not limited thereto. That is, the locations of the components may vary depending on operational performance and design. For example, the first cooler 140 may be disposed in the low temperature region CA according to an embodiment.

In an embodiment, the voltage generator 110 may operate in the high temperature region NA. The voltage generator 110 may generate a first voltage V1, and output the first voltage V1 to the voltage converter 130.

The voltage converter 130 may generate a second voltage V2 by converting the first voltage V1, and output the second voltage V2 to the memory 120. For example, the voltage converter 130 may generate the second voltage V2 corresponding to the first voltage V1 through a magnetic field-based method. The voltage converter 130 may adopt the magnetic field-based method to minimize a power loss when converting the first voltage V1 into the second voltage V2. Since the voltage converter 130 is disposed between the high temperature region NA and the low temperature region CA, the voltage converter 130 may be designed so that the heat of the high temperature region NA is not transferred to the low temperature region CA.

The memory 120 may operate in the low temperature region CA. The memory 120 may perform an internal operation based on the second voltage V2. For example, the memory 120 may include a DRAM, and the internal operation may include write, read and refresh operations.

The first cooler 140 may operate in the high temperature region NA. The first cooler 140 may generate a refrigerant FL1, and supply the refrigerant FL1 to the second cooler 150. For example, the first cooler 140 may include a motor and a condenser (not illustrated). The motor may induce a refrigerant FL2 in gaseous form from the second cooler 150 to the condenser based on temperature information. The condenser may liquefy the refrigerant FL2 in gaseous form with the refrigerant FL1 in liquid form. For example, the refrigerant FL1 may include liquid nitrogen. The liquid nitrogen has a liquid state at a cryogenic temperature (e.g., 77K) and is a popular refrigerant due to its low cost.

The second cooler 150 may operate in the low temperature region CA. The second cooler 150 may receive the refrigerant FL1 from the first cooler 140, and constantly maintain the temperature (e.g., 77K) in the low temperature region CA. For example, the second cooler 150 may include a temperature sensor and an evaporator (not illustrated). The temperature sensor may sense the temperature of the low temperature region CA to generate the temperature information. The evaporator may perform a heat absorbing operation of absorbing heat from the low temperature region CA by using the refrigerant FL1 in liquid form, and supply the gaseous refrigerant FL2 generated through the heat absorbing operation to the condenser according to the inducement of the motor.

Figure 2:
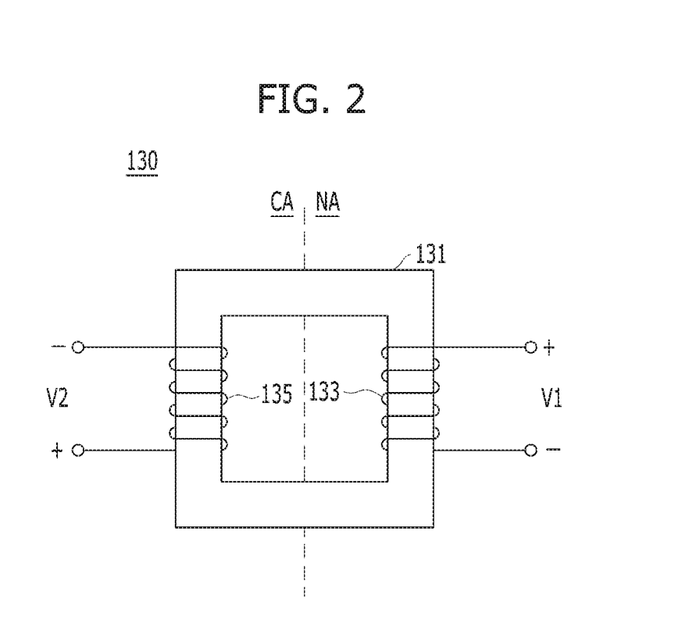
FIG. 2 is a configuration diagram illustrating a voltage converter, such as that shown in FIG. 1.

FIG. 2 is a configuration diagram illustrating the voltage converter 130, such as that shown in FIG. 1.

Referring to FIG. 2, the voltage converter 130 may include a core 131, a first coil 133 and a second coil 135.

The core 131 may be disposed between the high temperature region NA and the low temperature region CA. The core 131 may support the first coil 133 in the high temperature region NA and the second coil 135 in the low temperature region CA. The core 131 serves as a medium to transfer a magnetic field induced in the first coil 133 to the second coil 135. The core 131 may be made from a material having lower heat conductivity than a metal. For example, the core 131 may be made from plastic, ceramic or the like.

The first coil 133 may be coupled to the voltage generator 110. The first coil 133 may be wound around one side of the core 131, that is, the high temperature region NA side. The first coil 133 may induce a magnetic field as a first current corresponding to the first voltage V1 flows.

The second coil 135 may be coupled to the memory 120. The second coil 135 may be wound around the other side of the core 131, that is, the low temperature region CA side. As a second current flows according to the magnetic field transferred through the core 131, the second coil 135 may generate the second voltage V2 corresponding to the second current.

Hereinafter, an operation of the memory system 100 having the above-described structure in accordance with the present embodiment will be described.

In the high temperature region NA, the voltage generator 110 may generate the first voltage V1, and output the first voltage V1 to the voltage converter 130.

Between the high temperature region NA and the low temperature region CA, the voltage converter 130 may generate the second voltage V2 by converting the first voltage V1, and output the second voltage V2 to the memory 120. The voltage converter 130 may adopt the magnetic field-based method to minimize a power loss when converting the first voltage V1 into the second voltage V2. In addition, the voltage converter 130 may include the core 131 made from a material having lower heat conductivity than a metal (e.g., plastic, ceramic, etc.), so that the heat of the high temperature region NA is minimally transferred to the low temperature region CA.

In the low temperature region CA, the memory 120 may perform the internal operation by using the second voltage V2. For example, the internal operation may include write, read and refresh operations.

In the low temperature region CA, the second cooler 150 may maintain a cryogenic temperature state, e.g., 77K, by using the refrigerant FL1 in liquid form. The refrigerant FL1 may include liquid nitrogen, and the low temperature region CA may maintain the cryogenic temperature state according to the vaporization temperature of the liquid nitrogen, that is, 77K. The second cooler 150 may supply the refrigerant FL2 in gaseous form to the first cooler 140 according to the inducement of the first cooler 140. In the high temperature region NA, the first cooler 140 may liquefy the refrigerant FL2 in gaseous form with the refrigerant FL1 in liquid form.

According to the present embodiment, there is an advantage that a power loss and heat transfer can be minimized when the voltage is supplied from the high temperature region to the low temperature region.

Figure 3:
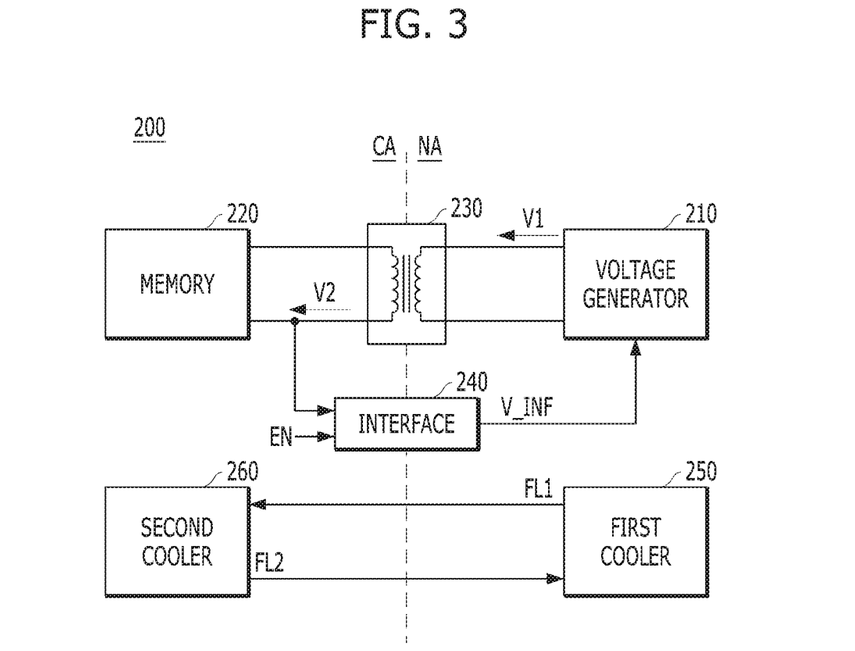
FIG. 3 is a block diagram illustrating a memory system in accordance with an embodiment.

FIG. 3 is a block diagram illustrating a memory system 200 in accordance with an embodiment.

Referring to FIG. 3, the memory system 200 may include a voltage generator 210, a memory 220, a voltage converter 230, an interface 240, a first cooler 250 and a second cooler 260.

The voltage generator 210 and the first cooler 250 may be disposed in a high temperature region NA because the voltage generator 210 and the first cooler 250 generate a relatively large amount of heat. For example, the high temperature region NA may have a temperature range including room temperature (e.g., 300K). The memory 220 and the second cooler 260 may be disposed in a low temperature region CA. For example, the low temperature region CA may have a temperature range including a cryogenic temperature (e.g., 77K or lower). The voltage converter 230 and the interface 240 may be disposed between the high temperature region NA and the low temperature region CA. In other words, a portion of the voltage converter 230 and a portion of the interface 240 may be disposed in the high temperature region NA, and the remaining portion of the voltage converter 230 and the remaining portion of the interface 240 may be disposed in the low temperature region CA (refer to FIGS. 4 and 5).

Although it is described in the present embodiment that the voltage generator 210 and the first cooler 250 of the memory system 200 are disposed in the high temperature region NA and the memory 220 and the second cooler 260 are disposed in the low temperature region CA, the present embodiment is not limited thereto. That is, the locations of the components may vary depending on operational performance and design. For example, the first cooler 250 may be disposed in the low temperature region CA according to an embodiment.

The voltage generator 210 may operate in the high temperature region NA. The voltage generator 210 may generate a first voltage V1 based on voltage information V_INF received from the interface 240, and output the first voltage V1 to the voltage converter 230. Since the voltage information V_INF is a result obtained by monitoring a second voltage V2, which is to be described later, the first and second voltages V1 and V2 may have stable voltage levels. In other words, the quality of the first and second voltages V1 and V2 may be greatly improved.

The voltage converter 230 may generate the second voltage V2 by converting the first voltage V1, and output the second voltage V2 to the memory 220. For example, the voltage converter 230 may generate the second voltage V2 corresponding to the first voltage V1 through a magnetic field-based method. The voltage converter 230 may adopt the magnetic field-based method to a power loss when converting the first voltage V1 into the second voltage V2. Since the voltage converter 230 is disposed between the high temperature region NA and the low temperature region CA, the voltage converter 130 may be designed so that the heat of the high temperature region NA is not transferred to the low temperature region CA.

The memory 220 may operate in the low temperature region CA. The memory 220 may perform an internal operation based on the second voltage V2. For example, the memory 220 may include a DRAM, and the internal operation may include write, read and refresh operations.

The interface 240 may output the voltage information V_INF corresponding to the second voltage V2 to the voltage generator 210 based on an enable signal EN. For example, the interface 240 may monitor the second voltage V2, and generate the voltage information V_INF corresponding to the monitoring result.

The enable signal EN may be activated during a period in which the second voltage V2 drops to reduce power consumption due to the interface 240. For example, the enable signal EN may be activated during a period in which the memory 220 uses the second voltage V2, that is, during the write, read or refresh operation.

The first cooler 250 may operate in the high temperature region NA. The first cooler 250 may generate a refrigerant FL1, and supply the refrigerant FL1 to the second cooler 260. For example, the first cooler 250 may include a motor and a condenser (not illustrated). The motor may induce a refrigerant FL2 in gaseous form from the second cooler 260 to the condenser based on temperature information. The condenser may liquefy the refrigerant FL2 in gaseous form with the refrigerant FL1 in liquid form. For example, the refrigerant FL1 may include liquid nitrogen. The liquid nitrogen has a liquid state at a cryogenic temperature (e.g., 77K) and is a popular refrigerant due to its low cost.

The second cooler 260 may operate in the low temperature region CA. The second cooler 260 may receive the refrigerant FL1 from the first cooler 250, and constantly maintain the constant temperature (e.g., 77K) of the low temperature region CA. For example, the second cooler 260 may include a temperature sensor and an evaporator (not illustrated). The temperature sensor may sense the temperature of the low temperature region CA to generate the temperature information. The evaporator may perform a heat absorbing operation of absorbing heat from the low temperature region CA by using the refrigerant FL1 in liquid form, and supply the gaseous refrigerant FL2 generated through the heat absorbing operation to the condenser according to the inducement of the motor.

Figure 4:
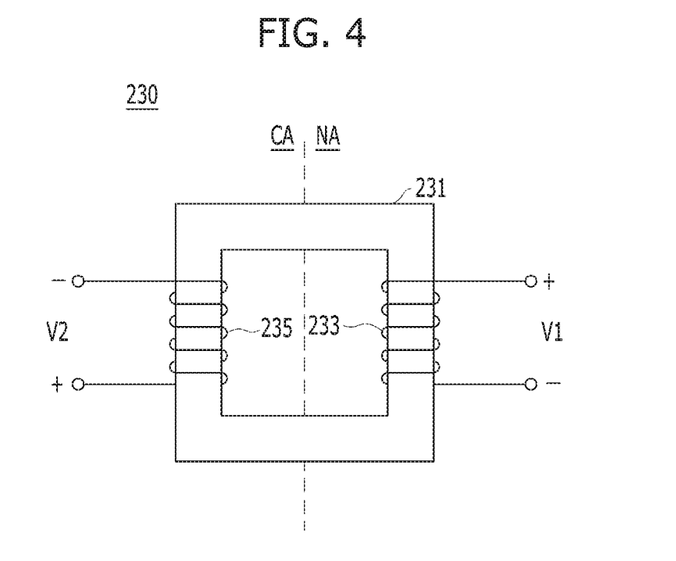
FIG. 4 is a configuration diagram illustrating a voltage converter, such as that shown in FIG. 3.

FIG. 4 is a configuration diagram illustrating the voltage converter 230, such as that shown in FIG. 3.

Referring to FIG. 4, the voltage converter 230 may include a core 231, a first coil 233 and a second coil 235.

The core 231 may be disposed between the high temperature region NA and the low temperature region CA. The core 231 may support the first coil 233 in the high temperature region NA, and support the second coil 235 in the low temperature region CA. The core 231 serves as a medium to transfer a magnetic field induced in the first coil 233 to the second coil 235. The core 231 may be made from a material having lower heat conductivity than a metal. For example, the core 231 may be made from plastic, ceramic or the like.

The first coil 233 may be coupled to the voltage generator 210. The first coil 233 may be wound around one side of the core 231, that is, the high temperature region NA side. The first coil 233 may induce a magnetic field as a first current corresponding to the first voltage V1 flows.

The second coil 235 may be coupled to the memory 220. The second coil 235 may coil around the other side of the core 231, that is, the low temperature region CA side. As a second current flows according to the magnetic field transferred through the core 231, the second coil 235 may generate the second voltage V2 corresponding to the second current.

Figure 5:
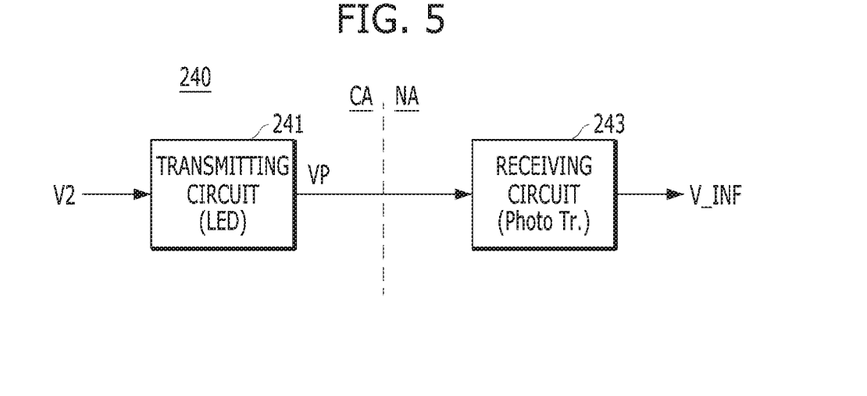
FIG. 5 is a block diagram illustrating an interface, such as that shown in FIG. 3.

FIG. 5 is a block diagram illustrating the interface 240, such as that shown in FIG. 3.

Referring to FIG. 5, the interface 240 may include an opto-coupler. Since the opto-coupler uses a light signal, heat transfer can be minimized. The interface 240 may include a transmitting circuit 241 and a receiving circuit 243.

The transmitting circuit 241 may be disposed in the low temperature region CA. The transmitting circuit 241 may generate transmission information VP based on the second voltage V2. For example, the transmitting circuit 241 may include a light emitting diode (LED). The LED may generate the light signal corresponding to the second voltage V2 as the transmission information VP.

The receiving circuit 243 may be disposed in the high temperature region NA. The receiving circuit 243 may generate the voltage information V_INF based on the transmission information VP. For example, the receiving circuit 243 may include a photo transistor (Photo Tr.).

Hereinafter, an operation of the memory system 200 having the above-described structure in accordance with the present embodiment will be described.

In the high temperature region NA, the voltage generator 210 may generate the first voltage V1 based on the voltage information V_INF, and output the first voltage V1 to the voltage converter 230. Since the voltage information V_INF is obtained by monitoring the second voltage V2, the first and second voltages V1 and V2 may have stable voltage levels.

Between the high temperature region NA and the low temperature region CA, the voltage converter 230 may generate the second voltage V2 by converting the first voltage V1, and output the second voltage V2 to the memory 220. The voltage converter 230 may adopt the magnetic field-based method to minimize a power loss when converting the first voltage V1 into the second voltage V2. In addition, the voltage converter 230 may include the core 131 made from a material having lower heat conductivity than a metal, e.g., plastic, ceramic, etc., so that the heat of the high temperature region NA that is transferred to the low temperature region CA can be minimized.

Between the high temperature region NA and the low temperature region CA, the interface 240 may monitor the second voltage V2, and output the voltage information V_INF corresponding to the monitoring result to the voltage generator 210. Since the voltage information V_INF is generated based on the light signal, the heat transfer by the interface 240 may be minimized. In addition, since the interface 240 is activated only during a specific operation or mode, the power consumption due to the interface 240 may be reduced. For example, the specific operation or mode may include the write, read and refresh operations. The interface 240 may be deactivated during a power-down mode of the memory 220.

In the low temperature region CA, the memory 220 may perform various internal operations by using the second voltage V2. The memory 220 may stably perform the internal operation by using the second voltage V2 having the stable voltage level. For example, the internal operation may include the write, read and refresh operations.

In the low temperature region CA, the second cooler 250 may maintain a cryogenic temperature state, e.g., 77K, by using the refrigerant FL1 in liquid form. The refrigerant FL1 may include liquid nitrogen, and the low temperature region CA may maintain the cryogenic temperature state according to the vaporization temperature of the liquid nitrogen, that is, 77K. The second cooler 260 may supply the refrigerant FL2 in gaseous form to the first cooler 250 according to the inducement of the first cooler 250. In the high temperature region NA, the first cooler 250 may liquefy the refrigerant FL2 in gaseous form with the refrigerant FL1 in liquid form.

According to the present embodiment, a power loss and heat transfer may be minimized when the voltage is supplied from the high temperature region to the low temperature region. In addition, a high quality voltage, i.e., voltage having stable levels, may be supplied, and the power consumption may be reduced when the high quality voltage is supplied.

Figure 6:
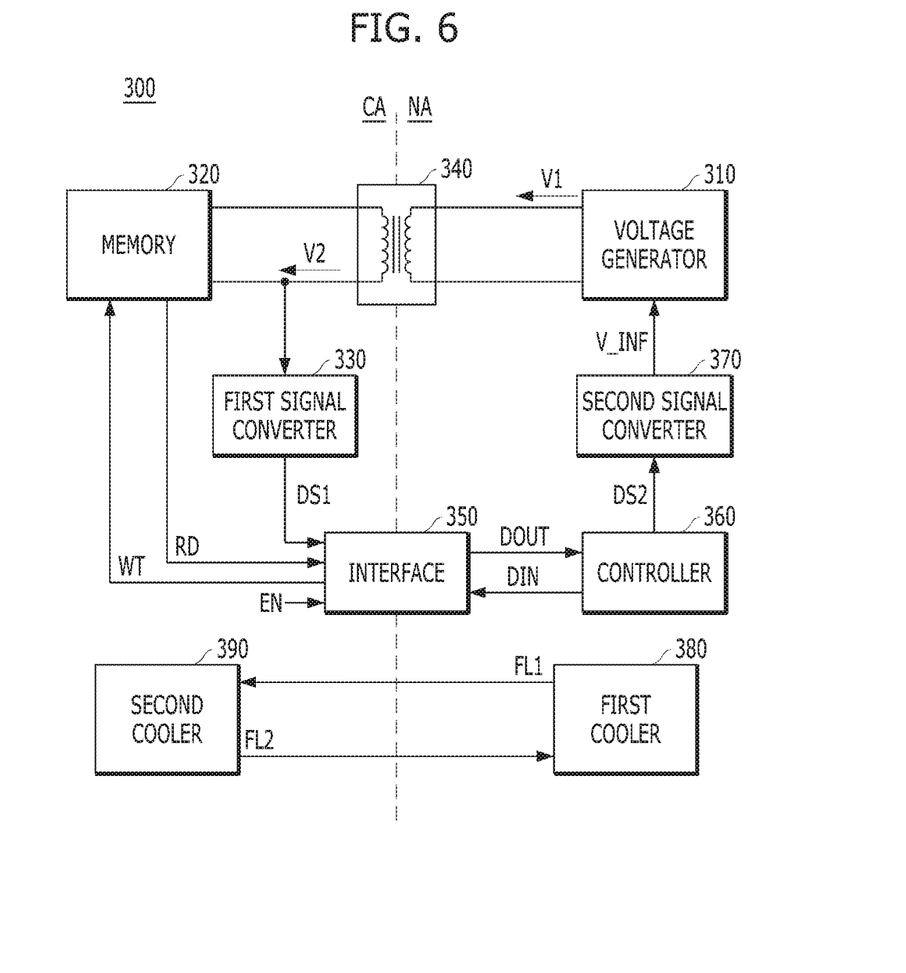
FIG. 6 is a block diagram illustrating a memory system in accordance with an embodiment.

FIG. 6 is a block diagram illustrating a memory system 300 in accordance with an embodiment.

Referring to FIG. 6, the memory system 300 may include a voltage generator 310, a memory 320, a first signal converter 330, a voltage converter 340, an interface 350, a controller 360, a second signal converter 370, a first cooler 380 and a second cooler 390.

The voltage generator 310, the controller 360, the second signal converter 370 and the first cooler 380 may be disposed in a high temperature region NA. Particularly, the voltage generator 300 and the first cooler 380 may be disposed in the high temperature region NA because the voltage generator 300 and the first cooler 380 generate a relatively large amount of heat. For example, the high temperature region NA may have a temperature range including room temperature (e.g., 300K). The memory 320, the first signal converter 330 and the second cooler 390 may be disposed in a low temperature region CA. For example, the low temperature region CA may have a temperature range including a cryogenic temperature (e.g., 77K or lower). The voltage converter 340 and the interface 350 may be disposed between the high temperature region NA and the low temperature region CA. In other words, a portion of the voltage converter 340 and a portion of the interface 350 may be disposed in the high temperature region NA, and the remaining portion of the voltage converter 340 and the remaining portion of the interface 350 may be disposed in the low temperature region CA (refer to FIGS. 7 and 8).

Although it is described in the present embodiment that the voltage generator 310, the controller 360, the second signal converter 370 and the first cooler 380 of the memory system 300 are disposed in the high temperature region NA and the memory 320, the first signal converter 330 and the second cooler 390 are disposed in the low temperature region CA, the present embodiment is not limited thereto. That is, the locations of the components may vary depending on operational performance and design. For example, the first cooler 380 may be disposed in the low temperature region CA according to an embodiment.

The voltage generator 310 may operate in the high temperature region NA. The voltage generator 310 may generate a first voltage V1 based on voltage information V_INF received from the second signal converter 370, and output the first voltage V1 to the voltage converter 340. Since the voltage information V_INF is obtained by monitoring a second voltage V2 which is to be described below, the first and second voltages V1 and V2 may have stable voltage levels. In other words, the qualities of the first and second voltages V1 and V2 may be greatly improved.

The voltage converter 340 may generate the second voltage V2 by converting the first voltage V1, and output the second voltage V2 to the memory 320. For example, the voltage converter 340 may generate the second voltage V2 corresponding to the first voltage V1 through a magnetic field-based method. The voltage converter 330 may adopt the magnetic field-based method to a power loss when converting the first voltage V1 into the second voltage V2. Since the voltage converter 340 is disposed between the high temperature region NA and the low temperature region CA, the voltage converter 130 may be designed so that the heat of the high temperature region NA is not transferred to the low temperature region CA.

The memory 320 may operate in the low temperature region CA. The memory 320 may perform various internal operations based on the second voltage V2. For example, the memory 220 may include a DRAM, and the internal operation may include write, read and refresh operations. The memory 320 may store a write data signal WT transferred from the interface 350 during the write operation, and output a read data signal RD to the interface 350 during the read operation.

The first signal converter 330 may operate in the low temperature region CA. The first signal converter 330 may generate a digital signal DS1 corresponding to the second voltage V2 received from the voltage converter 340. The digital signal DS1 may correspond to a result obtained by monitoring the second voltage V2. For example, the first signal converter 330 may include an analog-to-digital converter (not illustrated).

The interface 350 may generate a first information signal DOUT based on the digital signal DS1 and the read data signal RD, and generate the write data signal WT based on a second information signal DIN. The interface 350 may be activated based on an enable signal EN. The enable signal EN may be activated during a period in which the second voltage V2 drops to reduce power consumption due to the interface 350. For example, the enable signal EN may be activated during a period in which the memory 320 uses the second voltage V2, during the write, read or refresh operation.

The controller 360 may operate in the high temperature region NA. The controller 360 may output the first information signal DOUT as a feedback signal DS2 to the second signal converter 370 according to the monitoring operation, or process the first information signal DOUT according to the read operation. The controller 360 may generate the second information signal DIN according to the write operation. For example, the controller 360 may include a central processing unit (not illustrated) for controlling overall operations of the memory system 300.

The second signal converter 370 may operate in the high temperature region NA. The second signal converter 370 may generate an analog signal corresponding to the feedback signal DS2 as the voltage information V_INF. For example, the second signal converter 370 may include a digital-to-analog converter (not illustrated).

The first cooler 380 may operate in the high temperature region NA. The first cooler 380 may generate a refrigerant FL1, and supply the refrigerant FL1 to the second cooler 390. For example, the first cooler 380 may include a motor and a condenser (not illustrated). The motor may induce a refrigerant FL2 in gaseous form from the second cooler 390 to the condenser based on temperature information. The condenser may liquefy the refrigerant FL2 in gaseous form with the refrigerant FL1 in liquid form. For example, the refrigerant FL1 may include liquid nitrogen. The liquid nitrogen has a liquid state at a cryogenic temperature (e.g., 77K) and is a popular refrigerant due to its low cost.

The second cooler 390 may operate in the low temperature region CA. The second cooler 390 may receive the refrigerant FL1 from the first cooler 380, and constantly maintain the temperature (e.g., 77K) of the low temperature region CA. For example, the second cooler 390 may include a temperature sensor and an evaporator (not illustrated). The temperature sensor may sense the temperature of the low temperature region CA to generate the temperature information. The evaporator may perform a heat absorbing operation of absorbing heat from the low temperature region CA by using the refrigerant FL1 in liquid form, and supply the gaseous refrigerant FL2 generated through the heat absorbing operation to the condenser according to the inducement of the motor.

Figure 7:
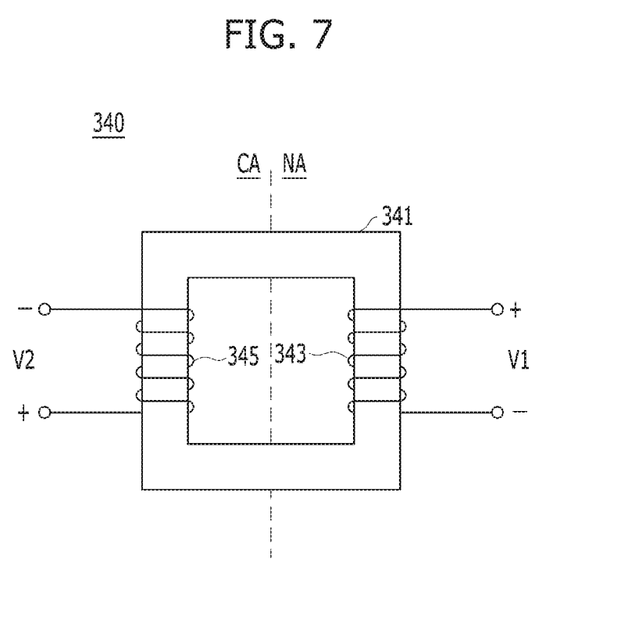
FIG. 7 is a configuration diagram illustrating a voltage converter, such as that shown in FIG. 6.

FIG. 7 is a configuration diagram illustrating the voltage converter 340, such as that shown in FIG. 6.

Referring to FIG. 7, the voltage converter 340 may include a core 341, a first coil 343 and a second coil 345.

The core 341 may be disposed between the high temperature region NA and the low temperature region CA. The core 341 may support the first coil 343 in the high temperature region NA, and support the second coil 345 in the low temperature region CA. The core 341 serves as a medium to transfer a magnetic field induced in the first coil 343 to the second coil 345. The core 341 may be made from a material having lower heat conductivity than a metal. For example, the core 341 may be made from plastic, ceramic or the like.

The first coil 343 may be coupled to the voltage generator 310. The first coil 343 may be wound around one side of the core 341, that is, the high temperature region NA side. The first coil 343 may induce the magnetic field as a first current corresponding to the first voltage V1 flows.

The second coil 345 may be coupled to the memory 320. The second coil 345 may be wound around the other side of the core 341, that is, the low temperature region CA side. As a second current flows according to the magnetic field transferred through the core 341, the second coil 345 may generate the second voltage V2 corresponding to the second current.

Figure 8:
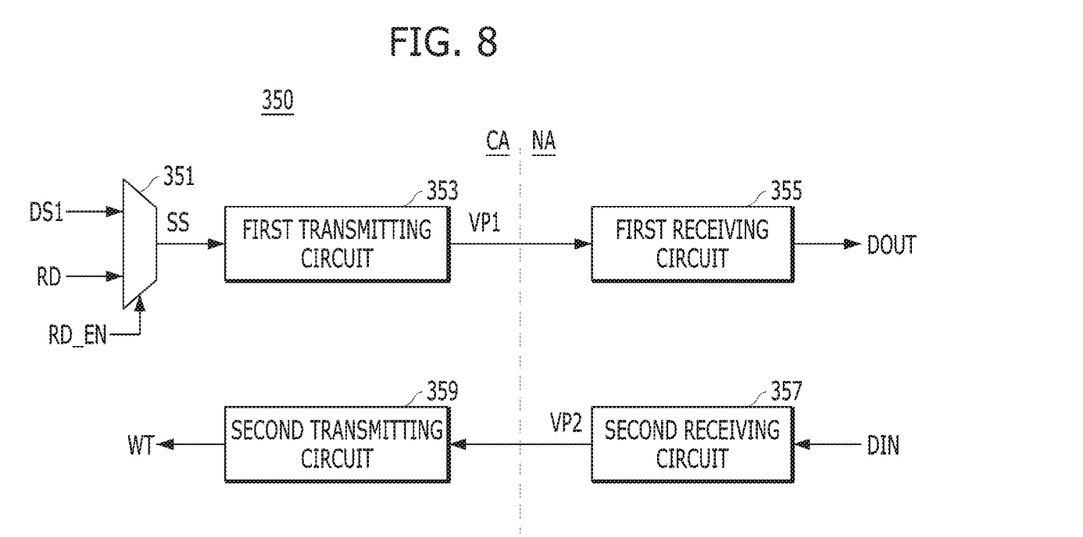
FIG. 8 is a block diagram illustrating an interface, such as that shown in FIG. 6.

FIG. 8 is a block diagram illustrating the interface 350, such as that shown in FIG. 6.

Referring to FIG. 8, the interface 350 may include a selecting circuit 351, a first transmitting circuit 353, a first receiving circuit 355, a second transmitting circuit 357 and a second receiving circuit 359.

The selecting circuit 351, the first transmitting circuit 353 and the second receiving circuit 359 may be disposed in the low temperature region CA. The first receiving circuit 355 and the second transmitting circuit 357 may be disposed in the high temperature region NA.

The selecting circuit 351 may output any one of the digital signal DS1 and the read data signal RD as a selection signal SS to the first transmitting circuit 353 based on a read control signal RD_EN. For example, the selecting circuit 351 may include a multiplexer.

The first transmitting circuit 353 may generate a first transmitting signal VP1 based on the selection signal SS, and output the first transmitting signal VP1 to the first receiving circuit 355. The first transmitting signal VP1 may be transferred through a first fiber-optic cable.

The first receiving circuit 355 may generate the first information signal DOUT based on the first transmitting signal VP1, and output the first information signal DOUT to the controller 360.

The second transmitting circuit 357 may generate a second transmitting signal VP2 based on the second information signal DIN, and output the second transmitting signal VP2 to the second receiving circuit 359. The second transmitting signal VP2 may be transferred through a second fiber-optic cable.

The second receiving circuit 359 may generate the write data signal WT based on the second transmitting signal VP2, and output the write data signal WT to the memory 320.

Hereinafter, an operation of the memory system 300 having the above-described structure in accordance with the present embodiment will be described.

In the high temperature region NA, the voltage generator 310 may generate the first voltage V1 based on the voltage information V_INF, and output the first voltage V1 to the voltage converter 340. Since the voltage information V_INF is obtained by monitoring the second voltage V2, the first and second voltages V1 and V2 may have stable voltage levels.

Between the high temperature region NA and the low temperature region CA, the voltage converter 340 may generate the second voltage V2 by converting the first voltage V1, and output the second voltage V2 to the memory 320. The voltage converter 340 may adopt the magnetic field-based method to minimize a power loss when converting the first voltage V1 into the second voltage V2. In addition, the voltage converter 340 may include the core 341 made from a material having lower heat conductivity than a metal, e.g., plastic, ceramic, etc., so that the heat of the high temperature region NA transferred to the low temperature region CA can be minimized.

In the low temperature region CA, the memory 320 may perform the internal operation by using the second voltage V2. The memory 320 may perform the stable internal operation by using the second voltage V2 having the stable voltage level. For example, the internal operation may include the write, read and refresh operations. The memory 320 may store the write data signal WT transferred from the interface 350 during the write operation. The memory 320 may output the read data signal RD to the interface 350 during the read operation.

In the low temperature region CA, the first signal converter 330 may generate the digital signal DS1 corresponding to the second voltage V2. The digital signal DS1 may correspond to the result obtained by monitoring the second voltage V2.

Between the high temperature region NA and the low temperature region CA, the interface 350 may generate the first information signal DOUT based on the digital signal DS1 and the read data signal RD, and generate the write data signal WT based on the second information signal DIN. The interface 350 may be activated based on the enable signal EN. The enable signal EN may be activated during the period in which the second voltage V2 drops to reduce the power consumption due to the interface 350. For example, the enable signal EN may be activated during the period in which the memory 320 uses the second voltage V2, that is, during the write, read or refresh operation.

In the high temperature region NA, the controller 360 may output the first information signal DOUT as the feedback signal DS2 to the second signal converter 370 according to the monitoring operation, or process the first information signal DOUT according to the read operation. The controller 360 may generate the second information signal DIN according to the write operation.

In the high temperature region NA, the second signal converter 370 may generate the analog signal corresponding to the feedback signal DS2 as the voltage information V_INF.

In the low temperature region CA, the second cooler 390 may maintain a cryogenic temperature state, e.g., 77K, by using the refrigerant FL1 in liquid form. The refrigerant FL1 may include liquid nitrogen, and the low temperature region CA may maintain the cryogenic temperature state according to the vaporization temperature of the liquid nitrogen, that is, 77K. The second cooler 390 may supply the refrigerant FL2 in gaseous form to the first cooler 380 according to the inducement of the first cooler 380. In the high temperature region NA, the first cooler 380 may liquefy the refrigerant FL2 in gaseous form with the refrigerant FL1 in liquid form.

According to the present embodiment, a power loss and heat transfer may be minimized when the voltage is supplied from the high temperature region to the low temperature region. In addition, a high quality voltage, i.e., voltage having stable levels, may be supplied, and the power consumption may be reduced when the high quality voltage is supplied. Furthermore, a circuit for interfacing a monitoring signal with a write data signal may be shared in the high and low temperature regions.

As is apparent from the above descriptions, in the memory system in accordance with the embodiments, heat generation is minimized, thereby minimizing the power consumption of the memory while preventing the malfunction of the memory that operates at the cryogenic temperature.

While various embodiments of the present disclosure has been illustrated and described with respect to specific embodiments, the disclosed embodiments are not intended to be restrictive. Further, it is noted that the various embodiments of the present disclosure may be achieved in various ways through substitution, change, and modification, as those skilled in the art will recognize in light of the present disclosure, without departing from the spirit and/or scope of the present disclosure. The present disclosure is intended to embrace all such substitutions, changes and modifications that fall within the scope of the following claims.

What is claimed is:

1. A memory system comprising:
    a voltage generator disposed in a high temperature region, and configured to generate a first voltage;
    a memory disposed in a low temperature region, and configured to use a second voltage; and
    a voltage converter disposed between the high temperature region and the low temperature region, configured to convert the first voltage into the second voltage,
    wherein, the voltage converter includes:
    a core disposed between the high temperature region and the low temperature region,
    a first coil coupled to the voltage generator and wound around a high temperature side of the core; and
    a second coil coupled to the memory and wound around a lower temperature side of the core.

2. The memory system of claim 1, wherein the low temperature region is a temperature of 77K or lower.

3. The memory system of claim 1,
    further comprising an interface disposed between the high temperature region and the low temperature region, and configured to output voltage information corresponding to the second voltage to the voltage generator, wherein the voltage generator generates the first voltage based on the voltage information.

4. The memory system of claim 3, wherein the interface includes an opto-coupler.

5. The memory system of claim 3, wherein the interface includes:
a transmitting circuit disposed in the low temperature region, and configured to generate transmission information based on the second voltage; and
a receiving circuit disposed in the high temperature region, and configured to generate the voltage information based on the transmission information.

6. The memory system of claim 3, wherein the interface is activated in a first mode of the memory, and deactivated in a second mode of the memory.

7. The memory system of claim 6,
wherein the first mode includes one or more of a write mode, a read mode and a refresh mode,
wherein the second mode includes a power-down mode.

8. The memory system of claim 1, further comprising:
a first cooler disposed in the high temperature region, and configured to generate a refrigerant; and
a second cooler disposed in the low temperature region, and configured to receive the refrigerant.

9. The memory system of claim 8, wherein the refrigerant includes liquid nitrogen.

10. The memory system of claim 8,
wherein the first cooler includes a condenser,
wherein the second cooler includes an evaporator.

11. The memory system of claim 1, wherein the core is made from a material having lower heat conductivity than a metal.

12. The memory system of claim 11, wherein the material includes any one or a combination of plastic and ceramic.

13. The memory system of claim 1, wherein the core includes a nonmetal.

14. A memory system comprising:
a voltage generator disposed in a high temperature region, and configured to generate a first voltage based on voltage information;
a memory disposed in a low temperature region, and configured to store a write data signal and outputting a read data signal by using a second voltage;
a first signal converter disposed in the low temperature region, and configured to generate a digital signal corresponding to the second voltage;
a voltage converter disposed between the high temperature region and the low temperature region, configured to convert the first voltage into the second voltage, and including a core made from a material having lower heat conductivity than a metal;
an interface disposed between the high temperature region and the low temperature region, and configured to generate a first information signal based on the read data signal and the digital signal, and generating the write data signal based on a second information signal;
a controller disposed in the high temperature region, and configured to output the first information signal as a feedback signal or processing the first information signal according to a read operation, and generating the second information signal according to a write operation; and
a second signal converter configured to generate the voltage information corresponding to the feedback signal.

15. The memory system of claim 14, wherein the low temperature region is of a temperature of 77K or lower.

16. The memory system of claim 14, wherein the material includes any one or a combination of plastic and ceramic.

17. The memory system of claim 14, wherein the voltage converter further includes:
a first coil coupled to the voltage generator and wound around a high temperature side of the core; and
a second coil coupled to the memory and wound around a lower temperature side of the core.

18. The memory system of claim 14, wherein the interface includes:
a selecting circuit disposed in the low temperature region, and configured to select any one of the digital signal and the read data signal based on a read control signal;
a first transmitting circuit disposed in the low temperature region, and configured to generate a first transmitting signal based on an output signal of the selecting circuit;
a first receiving circuit disposed in the high temperature region, and configured to generate the first information signal based on the first transmitting signal;
a second transmitting circuit disposed in the high temperature region, and configured to generate a second transmitting signal based on the second information signal; and
a second receiving circuit configured to generate the write data signal based on the second transmitting signal.

19. The memory system of claim 14, wherein the interface further includes:
a first fiber-optic cable configured to transfer the first transmitting signal; and
a second fiber-optic cable configured to transfer the second transmitting signal.

20. The memory system of claim 14, wherein the interface is activated in a first mode of the memory, and deactivated in a second mode of the memory.

21. The memory system of claim 14,
wherein the first mode includes one or more of a write mode, a read mode and a refresh mode,
wherein the second mode includes a power-down mode.

22. The memory system of claim 14, further comprising:
a first cooler disposed in the high temperature region, and configured to generate a refrigerant; and
a second cooler disposed in the low temperature region, and configured to receive the refrigerant.

23. The memory system of claim 22, wherein the refrigerant includes liquid nitrogen.

24. The memory system of claim 22,
wherein the first cooler includes a condenser,
wherein the second cooler includes an evaporator.

25. A cryogenic memory system including:
a voltage generator configured to generate a first voltage;
a cryogenic memory operable based on a second voltage; and
a voltage provider including a core made from a nonmetal, and configured to provide the cryogenic memory with the second voltage based on the first voltage received from the voltage generator, and to block heat transfer from a first temperature to a second temperature which is lower than the first temperature.

26. The cryogenic memory system of claim 25, further comprising:
a first cooler configured to generate a refrigerant including liquid nitrogen; and
a second cooler configured to receive the refrigerant including the liquid nitrogen.

27. The memory system of claim 25, wherein the non-metal includes any one or a combination of plastic and ceramic.

* * * * *